(12) United States Patent
Lee et al.

(10) Patent No.: US 6,535,538 B1
(45) Date of Patent: Mar. 18, 2003

(54) SURFACE EMITTING LASER DEVICE WITH MONOLITHICALLY INTEGRATED MONITOR PHOTODETECTOR

(75) Inventors: Yong Hee Lee, Taejon (KR); Il Young Han, Seoul (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 31 days.

(21) Appl. No.: 09/705,901

(22) Filed: Nov. 6, 2000

(30) Foreign Application Priority Data

Nov. 8, 1999 (KR) .............................. 99-49161

(51) Int. Cl.[7] ................................................ H01S 5/00
(52) U.S. Cl. .............................. 372/50; 372/39; 372/45
(58) Field of Search ............................ 372/50, 39, 40, 372/45, 96

(56) References Cited

U.S. PATENT DOCUMENTS 5,136,603 A * 8/1992 Hasnain et al. ............... 372/50
5,606,572 A * 2/1997 Swirhun et al. .............. 372/96
5,887,013 A * 3/1999 Lee et al. ...................... 372/50
6,320,891 B1 * 11/2001 Seko ............................. 372/50

* cited by examiner

Primary Examiner—Paul Ip
Assistant Examiner—Phillip Nguyen
(74) Attorney, Agent, or Firm—Bacon & Thomas (57) ABSTRACT

Disclosed is a surface emitting laser device with a monolithically integrated monitor photodetector, which is combined with an automatic power control circuit, thereby being capable of more accurately controlling the surface emitting laser output power. A method is also disclosed, which is adapted to fabricate the surface emitting laser device. In accordance with, the present invention, the surface emitting laser device includes insulating layers each sandwiched between an intrinsic semiconductor layer and a doped semiconductor layer in a monitor photodetector adapted to partially absorb light emitted from a surface emitting laser, thereby outputting a detect signal for the light. The insulating layers serve to remove photocurrent resulting from spontaneous emission light emitted from the surface emitting laser. By this configuration, it is possible to accurately control the power of light emitted from the surface emitting laser through a laser window.

8 Claims, 5 Drawing Sheets

SURFACE EMITTING LASER DEVICE WITH MONOLITHICALLY INTEGRATED MONITOR PHOTODETECTOR

BACKGROUND OF THE INVENTION

1. Field of the Invention

The present invention relates to a surface emitting laser device with a monolithically integrated monitor photodetector and a method for fabricating the same, and more particularly to a surface emitting laser device with a monolithically integrated monitor photodetector, which is combined with an automatic power control circuit, thereby being capable of more accurately controlling the surface emitting laser output power. The present invention also relates to a method for fabricating such a surface emitting laser device with a monolithically integrated monitor photodetector.

2. Description of the Related Art

As is well known, a surface emitting laser (SEL) has been highlighted as light emitting devices. Such a surface emitting laser is configured to emit light in a direction along which semiconductor layers are grown. In this regard, an array of surface emitting lasers can be integrated on a single substrate. Such a surface emitting laser also has an advantage in that it is unnecessary to use an optical system for a correction of the shape of light emitted. This is because the light emitted from a surface emitting laser has a circular shape, and exhibits an intensity of a Gaussian distribution.

It is desirable for the output power of such a surface emitting laser to be maintained at a constant intensity. To this end, it is necessary to use a monitor photodetector. Where such a monitor photodetector is integrated on a surface emitting laser, there are advantages in that it is possible to reduce the manufacturing costs and to simultaneously monitor an array of surface emitting lasers.

Figure 1:
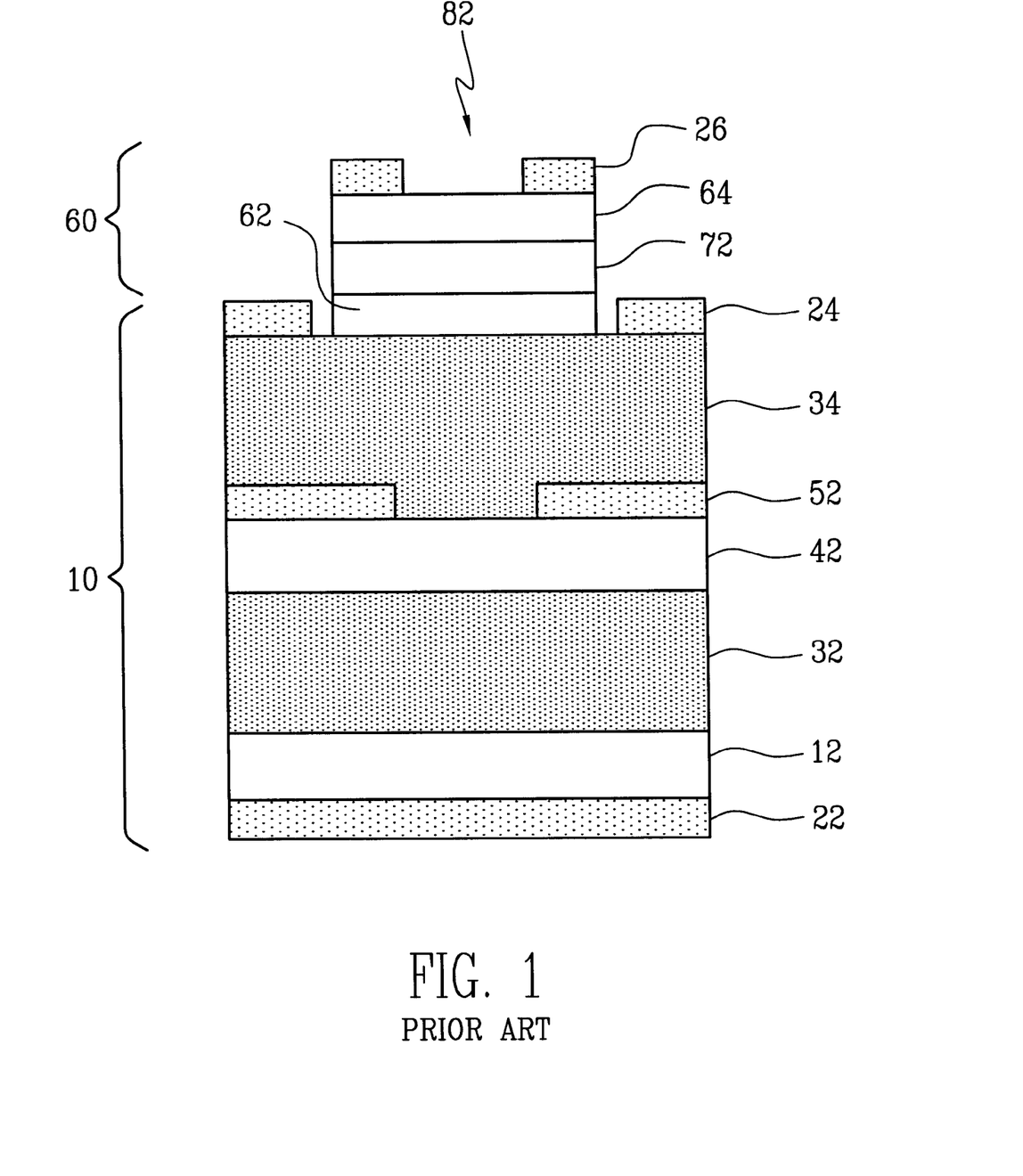
FIG. 1 is a schematic cross-sectional view illustrating a conventional surface emitting laser device with a monolithically integrated monitor photodetector.

FIG. 1 is a schematic cross-sectional view illustrating a conventional surface emitting laser device with a monolithically integrated monitor photodetector.

Referring to FIG. 1, the conventional surface emitting laser device includes a surface emitting laser (10) for emitting light in a direction, along which semiconductor layers are grown, and a monitor photodetector (60) formed on the surface emitting laser (10).

The surface emitting laser (10) includes a substrate (12), a gain medium layer (42) adapted to generate light, a pair of mirror layers, that is, a lower mirror layer (32) and an upper mirror layer (34), respectively arranged on lower and upper surfaces of the gain medium layer (42) and adapted to resonate the light generated from the gain medium layer (42), and a laser window (82) formed on the upper portion of the monitor photodetector (60) and adapted to allow the resonated light to be outwardly emitted. The surface emitting laser (10) also includes a first electrode (22) formed on the lower surface of the substrate (12), a second electrode (24) formed on the upper mirror layer (34) and provided at a central portion thereof with an opening for exposing the central portion, and an a high-resistance layer (52) sandwiched between the gain medium layer (42) and the upper mirror layer (34) and provided at a central portion thereof with an opening. The high-resistance layer (52) guides holes provided from the second electrode (24) to flow toward the gain medium layer (42) through the opening thereof.

When a forward bias is applied between the first and second electrodes (22 and 24), a recombination of electrons and holes occurs in the gain medium layer, so that light is generated. Of the generated light, only those of wavelengths meeting a resonance condition given by the lower and upper mirror layers (32 and 34) can remain. For the remaining light, the gain medium layer (42) induces those of the same wavelength and phase to be emitted, thereby eventually amplifying those light. The induced emission light, that is, laser beams, are outwardly emitted through the laser window (82).

Meanwhile, the monitor photodetector (60) includes a first doped semiconductor layer (62), an intrinsic semiconductor layer (72), a second doped semiconductor layer (64), and a third electrode (26) for outputting a signal detected by the monitor photodetector (60). The first and second doped semiconductor layers (62) and (64) have the different doping type whereas the first doped semiconductor layer (62) has the same doping type as the upper mirror layer (34).

The monitor photodetector (60) partially absorbs the light emitted from the surface emitting laser (10), thereby outputting an electrical signal proportional to the power of the absorbed light. The remaining light not absorbed by the monitor photodetector (60) is transmitted through the monitor photodetector (60), so that it is outwardly emitted through the laser window (82).

The detect signal outputted from the monitor photodetector (60) is proportional to the output power of the surface emitting laser (10) emitted through the laser window (82). Accordingly, it is possible to control the surface emitting laser (10) to output power of a constant intensity by feeding back the detect signal from the monitor photodetector (60), and controlling the drive current applied to the surface emitting laser (10), that is, the drive current applied to each of the first and second electrodes (22 and 24), in accordance with the control operation of an automatic power control circuit based on the feedback detect signal. Alternatively, the output power of the surface emitting laser (10) may be varied in accordance with a variation in drive current.

On the other hand, the surface emitting laser (10) emits not only the induced emission light, but also spontaneous emission light. This spontaneous emission light is different from the induced emission light in terms of characteristics in that it consists of mixed light of different wavelengths and different phases. For this reason, the light detected by the monitor photodetector (60) includes both the induced emission light and the spontaneous emission light. Accordingly, the detect signal of the monitor photodetector (60) is influenced by the spontaneous emission light. As a result, it is difficult to accurately control the power of light emitted from the surface emitting laser (10), based on the detect signal outputted from the monitor photodetector (60), because of the spontaneous emission light.

SUMMARY OF THE INVENTION

Therefore, a first object of the invention is to provide a surface emitting laser device with a monolithically integrated monitor photodetector, which is capable of effectively cutting off photocurrent resulting from spontaneous emission light while allowing only photocurrent, resulting from laser light, to flow through the monitor photodetector, thereby achieving an accurate control for the power of light emitted from a surface emitting laser thereof.

A second object of the invention is to provide a method for fabricating a surface emitting laser device with a monolithically integrated monitor photodetector, which is capable of accomplishing the first object.

In accordance with one aspect, the present invention provides a surface emitting laser device comprising:

a surface emitting laser including a substrate, a lower mirror layer, a gain medium layer, and an upper mirror layer sequentially grown on an upper surface of the substrate, a first electrode formed at a lower surface of the substrate, and a second electrode formed on the upper mirror layer and provided at a central portion thereof with an opening for exposing the central portion, the surface emitting laser serving to emit light in a growth direction of the layers in response to a drive current applied to the first and second electrodes; and a monolithically integrated monitor photodetector formed on a portion of the upper mirror layer exposed through the opening of the second electrode, the monitor photodetector serving to partially absorb the light emitted from the surface emitting laser, thereby outputting a detect signal for the light, wherein the monitor photodetector comprises a first doped semiconductor layer, an intrinsic semiconductor layer, and a second doped semiconductor layer sequentially grown on the portion of the upper mirror layer exposed through the second electrode, a third electrode formed on the second doped semiconductor layer and provided at a central portion thereof with an opening for exposing the central portion of the third electrode, and lower and upper insulating layers respectively sandwiched between the first doped semiconductor layer and the intrinsic semiconductor layer and between the intrinsic semiconductor layer and the second doped semiconductor layer, each of the insulating layers having an opening at a central portion thereof and serving to remove a photocurrent resulting from a spontaneous emission light emitted from the surface emitting laser.

Preferably, each of the first and second doped semiconductor layers comprises a number of grown layers. The uppermost one of the grown layers in the first doped semiconductor layer and the lowermost one of the grown layers in the second doped semiconductor layer are made of AlxGa1-xAs (provided, $0.95 \leq x \leq 1$). The lower and upper insulating layers are made of oxidized AlxGa1-xAs.

More preferably, the first doped semiconductor layer comprises a Zn-doped AlyGa1-yAs layer and a Zn-doped AlxGa1-xAs layer grown in this order (provided, $0.95 \leq x \leq 1$; and $0 \leq y \leq 0.5$). The second doped semiconductor layer comprises an Si-doped AlxGa1-xAs, an Si-doped AlyGa1-yAs layer, and an Si-doped GaAs layer grown in this order. The lower and upper insulating layers are formed by laterally oxidizing the Zn-doped AlxGa1-xAs layer and the Si-doped AlxGa1-xAs layer, respectively.

The intrinsic semiconductor layer is located at a maximum internal light intensity of the surface emitting laser.

The surface emitting laser device may further comprise a high-resistance layer sandwiched between the gain medium layer and the upper mirror layer and provided at a central portion thereof with an opening, the high-resistance layer serving to guide holes to flow only through the central opening thereof. The high-resistance layer is formed by implanting protons into the upper mirror layer, or made of an oxide of AlxGa1-xAs (provided, $0.95 \leq x \leq 1$).

In accordance with another aspect, the present invention provides a method for fabricating a surface emitting laser device including a surface emitting laser consisting of a substrate, a lower mirror layer, a gain medium layer, and an upper mirror layer sequentially grown on an upper surface of the substrate, a first electrode formed at a lower surface of the substrate, and a second electrode formed on the upper mirror layer and provided at a central portion thereof with an opening for exposing the central portion, the surface emitting laser serving to emit light in a growth direction of the layers in response to a drive current applied to the first and second electrodes, and a monolithically integrated monitor photodetector formed on a portion of the upper mirror layer exposed through the opening of the second electrode, the monitor photodetector serving to partially absorb the light emitted from the surface emitting laser, thereby outputting a detect signal for the light, comprising, to fabricate the monitor photodetector, the steps of:

sequentially growing a Zn-doped AlyGa1-yAs layer and a Zn-doped AlxGa1-xAs layer on the upper mirror layer, thereby forming a first doped semiconductor layer on the upper mirror layer;

forming an intrinsic semiconductor layer made of GaAs on the first doped semiconductor layer;

sequentially growing a Si-doped AlxGa1-xAs layer, a Si-doped AlyGa1-yAs layer, and a Si-doped GaAs layer on the intrinsic semiconductor layer, thereby forming a second doped semiconductor layer on the intrinsic semiconductor layer; and wet-oxidizing a structure obtained after the formation of the second doped semiconductor layer to laterally oxidize the Zn-doped AlxGa1-xAs layer and the Si-doped AlxGa1-xAs layer, starting from side surfaces thereof, while preventing central portions thereof from being oxidized, thereby forming lower and upper insulating layers, respectively (provided, $0.95 \leq x \leq 1$; and $0 \leq y \leq 0.5$).

In the surface emitting laser device according to the present invention, photocurrent resulting from a large part of spontaneous emission light emitted from the surface emitting laser is removed by nonradiative recombination centers located at respective interfaces between the lower insulating layer and the intrinsic semiconductor layer and between the intrinsic semiconductor layer and the upper insulating layer. Accordingly, it is possible to accurately control the power of light emitted from the surface emitting laser device through the laser window by feeding back a detect signal outputted from the monitor photodetector to the surface emitting layer, as drive current, via an automatic power control circuit.

BRIEF DESCRIPTION OF THE DRAWINGS

The above objects, and other features and advantages of the present invention will become more apparent after a reading of the following detailed description when taken in conjunction with the drawings, in which:

FIGS. 2a and 2b illustrate a surface emitting laser device with a monolithically integrated monitor photodetector in accordance with an embodiment of the present invention, respectively. FIG. 2a is a plan view of the surface emitting laser device whereas FIG. 2b is a cross-sectional view taken along the line A–A' of FIG. 2a.

BRIEF DESCRIPTION OF THE EMBODIMENTS

Now, preferred embodiments of the present invention will be described in detail, with reference to the annexed drawings.

Figure 2A:
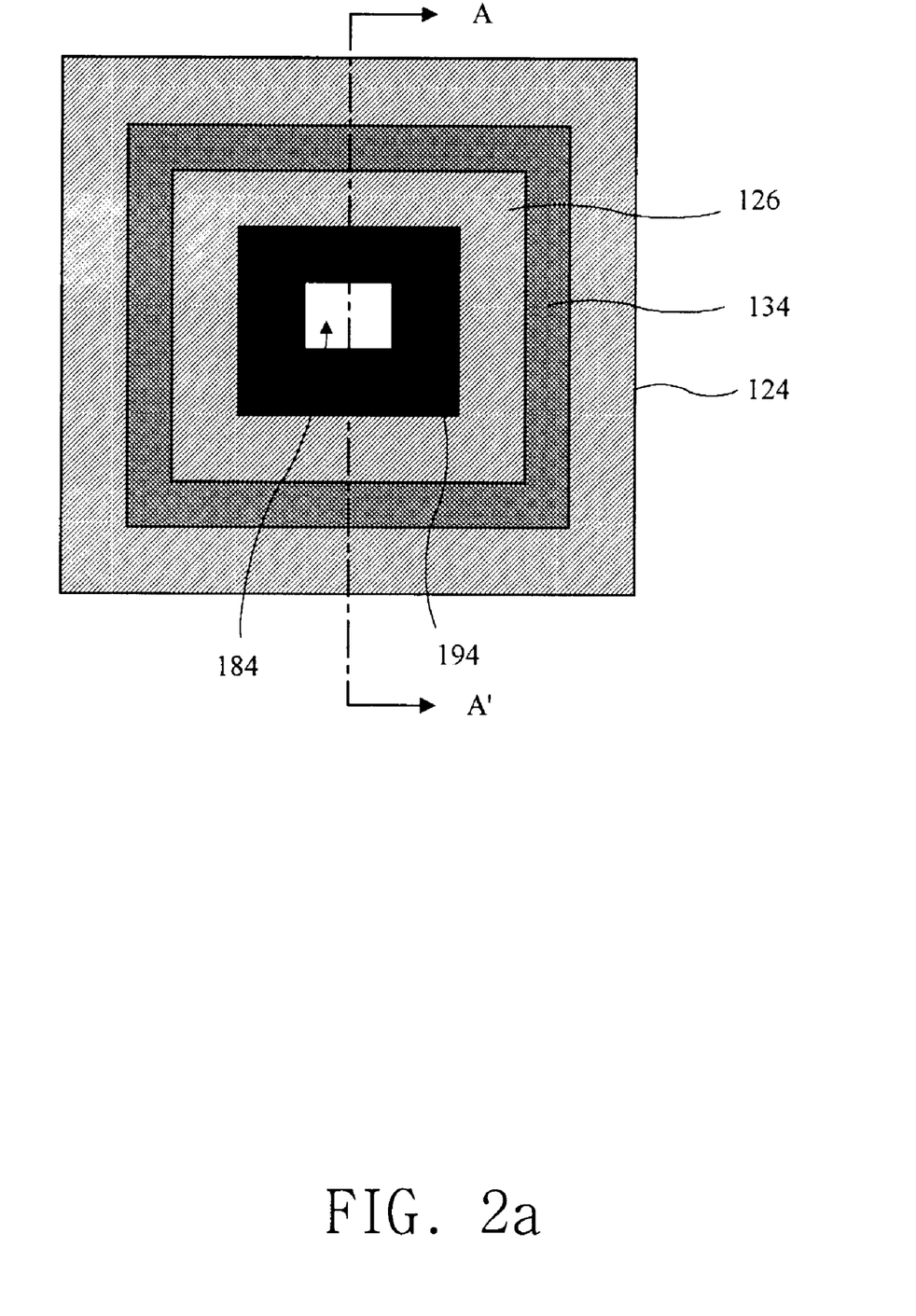
Figure 2B:
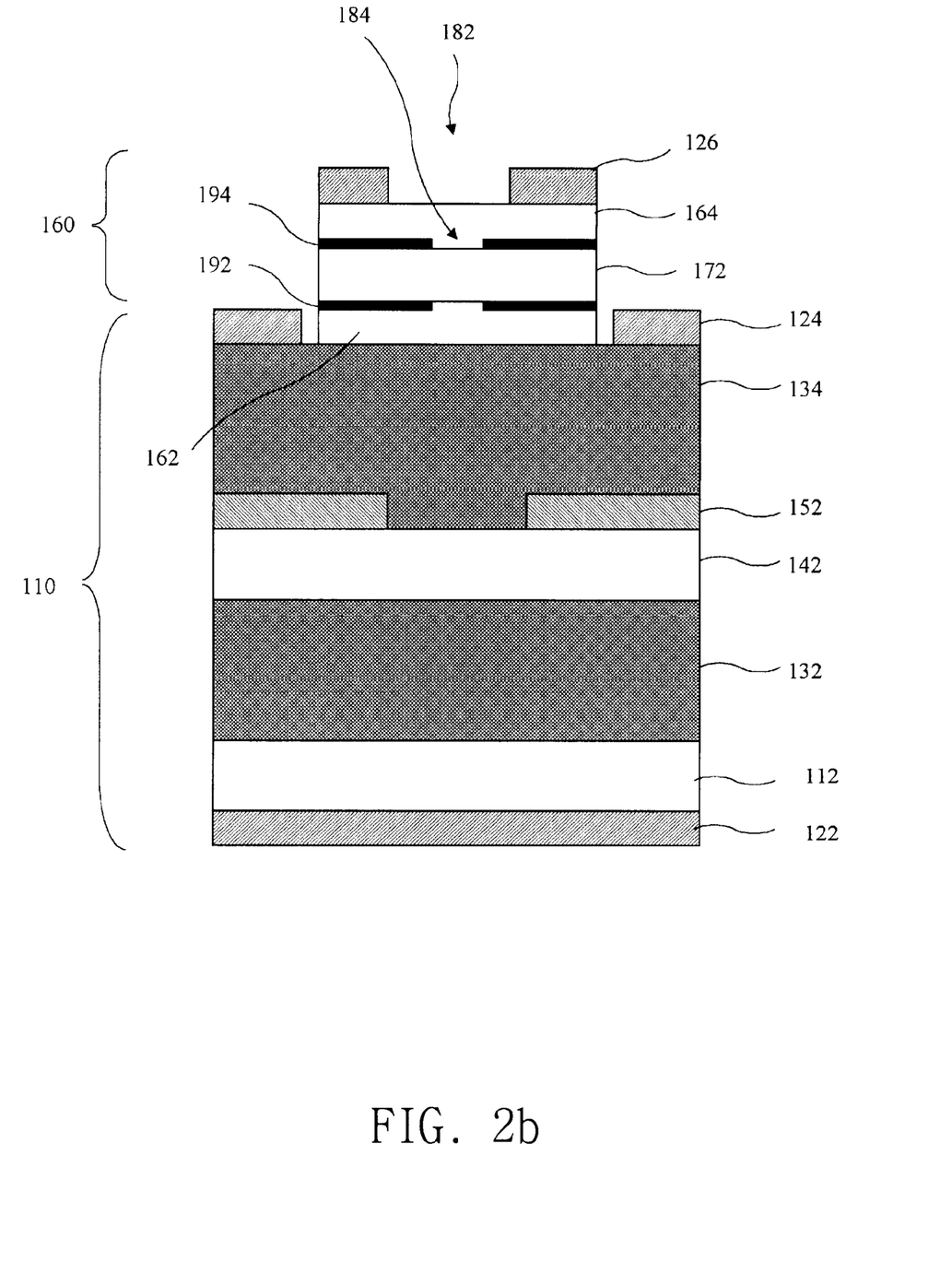

FIGS. 2a and 2b illustrate a surface emitting laser device with a monolithically integrated monitor photodetector in accordance with an embodiment of the present invention, respectively. FIG. 2a is a plan view of the surface emitting laser device whereas FIG. 2b is a cross-sectional view taken along the line A–A' of FIG. 2b.

Referring to FIGS. 2a and 2b, the surface emitting laser device includes a surface emitting laser (110) for emitting light in a direction, along which semiconductor layers are grown, and a monitor photodetector (160) formed on the surface emitting laser (110). The monitor photodetector (160) serves to partially receive light emitted from the surface emitting laser (110), thereby detecting the power of light emitted from the surface emitting laser (110).

The surface emitting laser (110) includes a substrate (112) made of GaAs doped with Si, and a number of layers sequentially grown on the substrate (112). The grown layers include a lower mirror layer (132), a gain medium layer (142), and an upper mirror layer (134). The surface emitting laser (110) also includes a first electrode (122) formed on the lower surface of the substrate (112), a second electrode (124) formed on the upper mirror layer (134) and provided at a central portion thereof with an opening for exposing the central portion, and an a high-resistance layer (152) sandwiched between the gain medium layer (142) and the upper mirror layer (134) and provided at a central portion thereof with an opening of 7 $\mu$m.

The lower mirror layer (132) has a multi-layer structure including alternate layers of Si-doped Al0.9Ga0.1As and Si-doped Al0.3Ga0.7As while having 40 periods (In some nomenclatures, the pair of alternate layers is called a "period"). The upper mirror layer (134) has a multi-layer structure including alternate layers of C-doped Al0.9Ga0.1As and C-doped Al0.3Ga0.7As while having 28 periods. On the other hand, the gain medium layer (142) has a multi-layer structure including alternate layers of Al0.3Ga0.7As and Al0.11Ga0.89As grown to form four quantum wells. The high-resistance layer (152) guides holes to flow only through the central opening thereof, by virtue of its high resistance. This high-resistance layer (152) is formed by implanting protons, for example, hydrogen nuclei, into the upper mirror layer (134), or depositing an AlxGa1-xAs layer, and then oxidizing the deposited AlxGa1-xAs layer, except for a central portion thereof (provided, $0.95 \leq x \leq 1$).

When a forward bias is applied between the first and second electrodes (122 and 124), that is, when a negative voltage is applied to the first electrode (122), and a positive voltage is applied to the second electrode (124), a recombination of electrons and holes occurs in the gain medium layer (142), so that light is generated. Of the generated light, only those of wavelengths meeting a resonance condition given by the lower and upper mirror layers (32 and 34) can remain. For the remaining light, the gain medium layer (142) induces those of the same wavelength and phase to be emitted, thereby eventually amplifying those light. The induced emission light, that is, laser beams, are outwardly emitted through the laser window (182).

Meanwhile, the monitor photodetector (160) includes a number of semiconductor layers sequentially grown on a portion of the upper mirror layer (134) exposed through the opening of the second electrode (124). That is, the monitor photodetector (160) includes a first doped semiconductor layer (162), an intrinsic semiconductor layer (172), and a second doped semiconductor layer (164). The monitor photodetector (160) also includes a third electrode (126) formed on the second doped semiconductor layer (164) and provided with an opening for exposing the central portion of the second doped semiconductor layer (164), and a pair of insulating layers, that is, a lower insulating layer (192) and an upper insulating layer (194), respectively sandwiched between the first doped semiconductor layer (162) and the intrinsic semiconductor layer (172) and between the intrinsic semiconductor layer (172) and the second doped semiconductor layer (164). Each of the insulating layers (192 and 194) has an opening at the central portion thereof.

The first doped semiconductor layer (162) includes a Zn-doped Al0.3Ga0.7As layer and a Zn-doped AlAs layer grown in this order. The second doped semiconductor layer (164) includes an Si-doped AlAs layer, an Si-doped Al0.3Ga0.7As layer, and an Si-doped GaAs layer grown in this order. That is, respective AlAs layers of the first and second semiconductor layers (162 and 164) are in contact with the lower and upper surfaces of the intrinsic semiconductor layer (172). On the other hand, the intrinsic semiconductor layer (172) is made of GaAs.

The lower and upper insulating layers (192 and 194) are formed by laterally oxidizing the Zn-doped AlAs layer and the Si-doped AlAs layer of the first and second semiconductor layers (162 and 164), respectively contacting the lower and upper surfaces of the intrinsic semiconductor layer (172), except for the central portions thereof. In order to allow the intrinsic semiconductor layer (172) to more sensitively respond to the laser output from the surface emitting laser (110), the first and second doped semiconductor layers (162 and 164) are controlled in thickness so that the intrinsic semiconductor layer (172) is located at a maximum internal light intensity of the surface emitting laser (110).

The monitor photodetector (160) partially absorbs the light emitted from the surface emitting laser (110) in a state in which a reverse bias is applied between the second and third electrodes (124 and 126), that is, when a negative voltage is applied to the second electrode, and a positive voltage is applied to the third electrode. The monitor photodetector (160) then outputs, at the third electrode (126), an electrical signal proportional to the power of the absorbed light. The remaining light not absorbed by the monitor photodetector (160) is transmitted through the monitor photodetector (160), so that it is outwardly emitted through the laser window (182).

The surface emitting laser (110) emits not only the induced emission light, but also spontaneous emission. However, electrons and holes created in the intrinsic semiconductor layer (172) due to the spontaneous emission light are removed by nonradiative recombination centers located at respective interfaces of the lower and upper insulating layers (192 and 194) adjacent to the intrinsic semiconductor layer (172). Accordingly, only the current resulting from electrons and holes created in the intrinsic semiconductor layer (172) due to the laser light flows toward the third electrode (126) through the central portions of the first and second doped semiconductor layers (162 and 164). The central portions of the first and second doped semiconductor layers (162 and 164) are denoted by the reference numeral (184) in FIG. 2a.

As a result, the detect signal outputted from the monitor photodetector (160) is proportional to the power of the induced emission light, that is, laser beams, emitted through the laser window (182). Based on the power of light detected by the monitor photodetector (160), therefore, it is possible to measure a variation in the intensity of laser beams emitted through the laser window (182). Accordingly, the electrical signal obtained based on the detected light power is fed back, as drive current, to the surface emitting layer (110) via an automatic power control circuit. Thus, it is possible to accurately control the power of light emitted from the surface emitting laser device through the laser window (182).

The following description will be made in conjunction with a method for fabricating the surface emitting laser device with the monolithically integrated monitor photodetector, which is illustrated in FIGS. 2a and 2b. In order to avoid a repeated description, only the process of fabricating the monitor photodetector (160) distinguished from the conventional monitor photodetector will be described.

First, a Zn-doped Al0.3Ga0.7As layer and a Zn-doped AlAs layer are sequentially grown on the upper mirror layer 134, thereby forming the first doped semiconductor layer 162. A GaAs layer is then formed on the first doped semiconductor layer (162) to form the intrinsic semiconductor layer (172). Subsequently, an Si-doped AlAs layer, an Si-doped Al0.3Ga0.7As layer, and an Si-doped GaAs layer are grown, in this order, on the intrinsic semiconductor layer (172), thereby forming the second doped semiconductor layer (164).

In accordance with a process featured by the present invention, the resulting structure is then wet-oxidized at 450° C. in such a fashion that the Zn-doped AlAs layer of the first doped semiconductor layer (162) and the Si-doped AlAs layer of the second doped semiconductor layer (164) are laterally oxidized, starting from side surfaces thereof. By this wet oxidation, the lower and upper insulating layers (192 and 194) are formed. At this time, the oxidation time is controlled in order to prevent the central portions (184) of the AlAs layers from being oxidized. The size of each central portion (184) is reduced as an increased oxidation time is used.

Figure 3A:
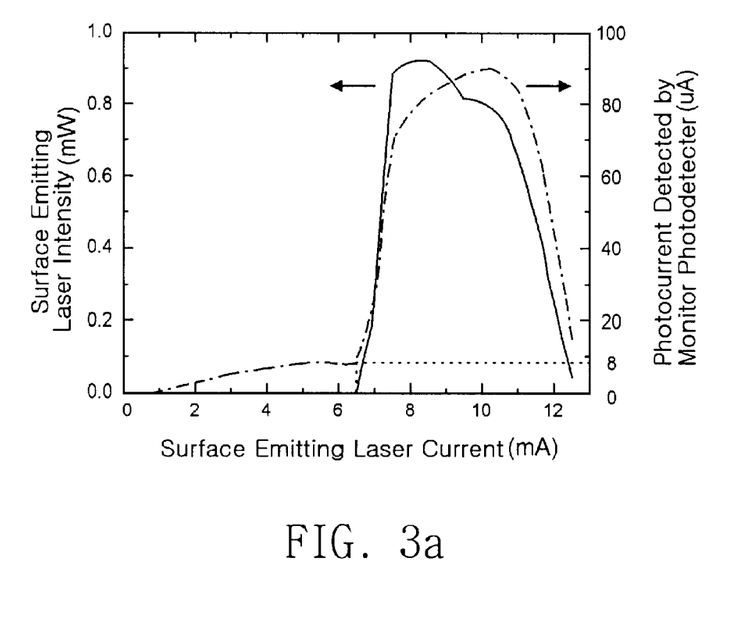
FIGS. 3a to 3c are graphs for evaluating the effect of the monitor photodetector of FIG. 2b, respectively.
Figure 3B:
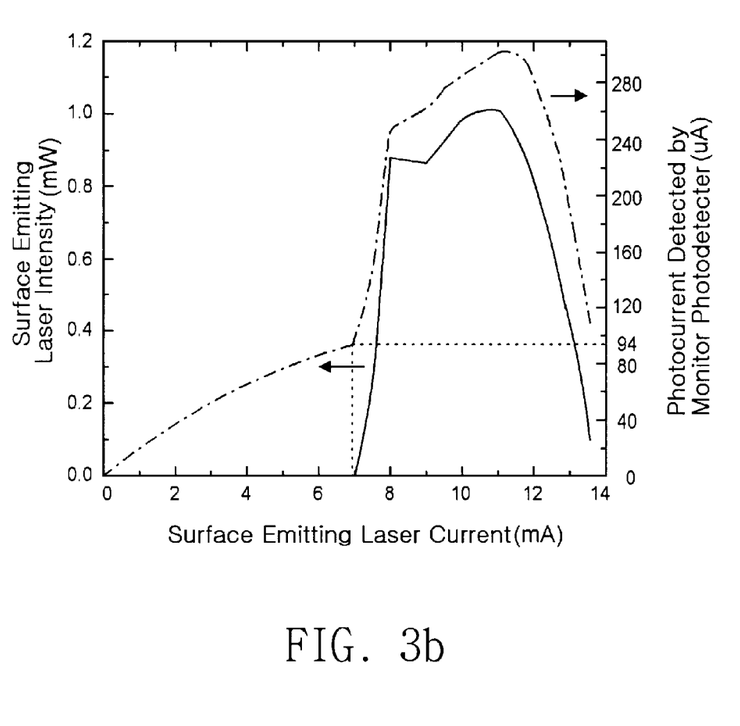
Figure 3C:
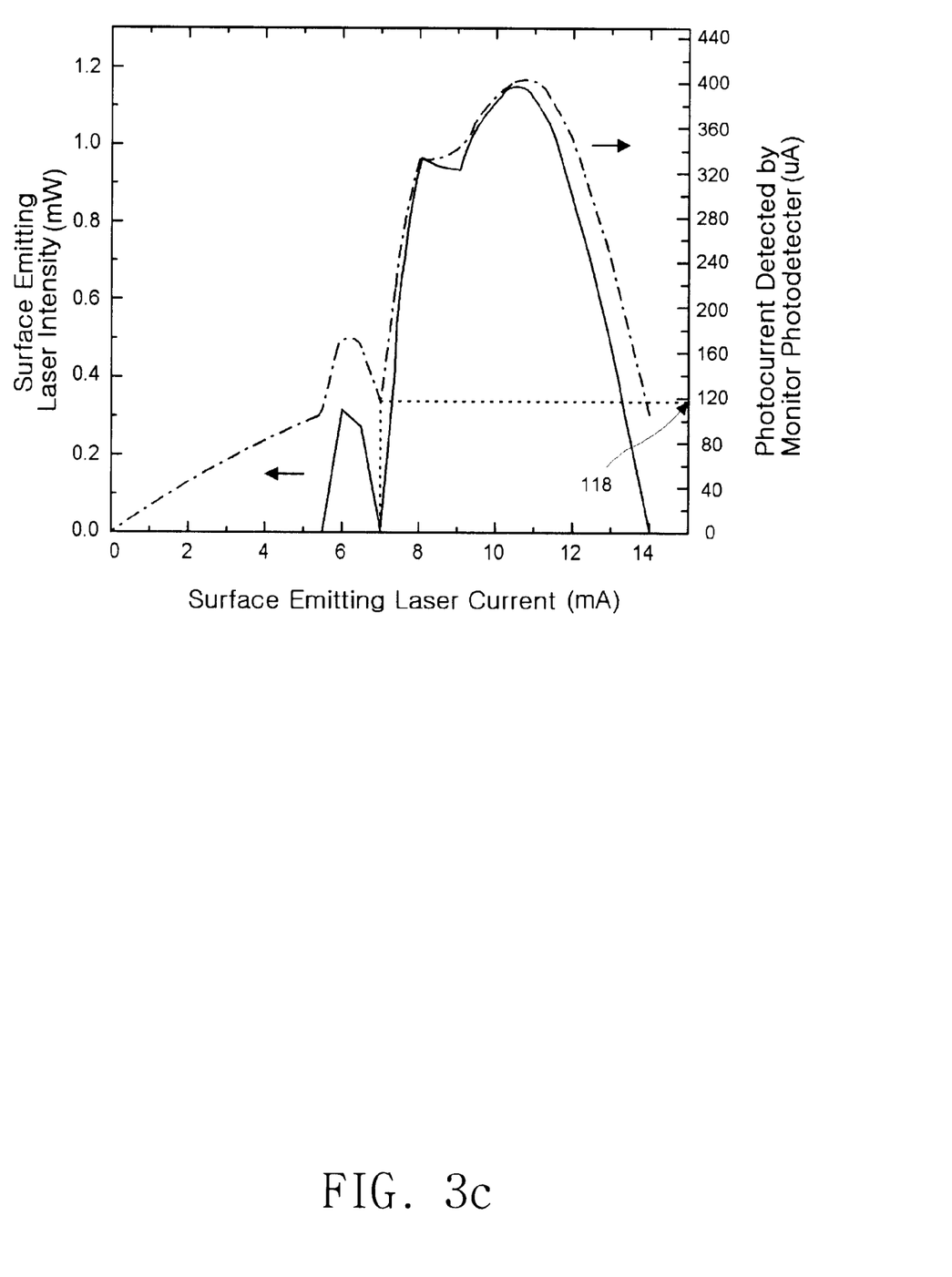

FIGS. 3a to 3c are graphs for evaluating the effect of the monitor photodetector (160) of FIG. 2b, respectively. In FIGS. 3a to 3c, the results are depicted which are obtained after measuring variations in photocurrent and surface emitting laser intensity depending on a variation in drive current, using the monitor photodetector (160) along with a separate external photodetector. In each case, the measurement was conducted after applying a drive current to the surface emitting laser (110) via the first and second electrodes (122 and 124). FIG. 3a is associated with the case in which the central portions (184) of the lower and upper insulating layers (192 and 194) have a size of 2 μm whereas FIG. 3b is associated with the case in which the central portions (184) have a size of 18 μm. On the other hand, FIG. 3c is associated with the case in which the photodetector is not formed with the lower and upper insulating layers (192 and 194).

In FIG. 3a, the graph depicted by a dotted line shows a variation in photocurrent measured by the monitor photodetector (160), and the graph depicted a solid line shows a variation in surface emitting laser intensity measured by the external photodetector. Referring to FIG. 3a, it can be found that the response of the monitor photodetector (160) agrees well with the response of the external photodetector. It can also be found that the photocurrent detected by the monitor photodetector (160) at the threshold current of the surface emitting laser corresponds to 8 μA. On the other hand, in the cases of FIGS. 3b and 3c, photocurrent of 94 μA and 118 μA are detected by the monitor photodetector (160) at the threshold current of the surface emitting laser, respectively.

Thus, it can be found that the surface emitting laser device with the monolithically integrated monitor photodetector having the lower and upper insulating layers (192 and 194) exhibits a superior performance, as compared to the case in which the monitor photodetector have not those insulating layers. It can also be found that the case, in which the central portion (184) of each insulating layer has a size of 2 μm, exhibits a performance enhanced by over 10 times, as compared to the case in which the central portion (184) has a size of 18 μm.

As apparent from the above description, in the surface emitting laser device with the monolithically integrated monitor photodetector according to the present invention, photocurrent resulting from a large part of spontaneous emission light emitted from the surface emitting laser (110) is removed by nonradiative recombination centers located at respective interfaces between the lower insulating layer (192) and the intrinsic semiconductor layer (172) and between the intrinsic semiconductor layer (172) and the upper insulating layer (194). Accordingly, it is possible to accurately control the power of light emitted from the surface emitting laser device through the laser window (182) by feeding back a detect signal outputted from the monitor photodetector (160) to the surface emitting layer (110), as drive current, via the automatic power control circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A surface emitting laser device comprising:
    a surface emitting laser including a substrate, a lower mirror layer, a gain medium layer, and an upper mirror layer sequentially grown on an upper surface of the substrate, a first electrode formed at a lower surface of the substrate, and a second electrode formed on the upper mirror layer and provided at a central portion thereof with an opening for exposing the central portion, the surface emitting laser serving to emit light in a growth direction of the layers in response to a drive current applied to the first and second electrodes; and
    a monolithically integrated monitor photodetector formed on a portion of the upper mirror layer exposed through the opening of the second electrode, the monitor photodetector serving to partially absorb the light emitted from the surface emitting laser, thereby outputting a detect signal for the light,
    wherein the monitor photodetector comprises
        a first doped semiconductor layer, an intrinsic semiconductor layer, and second doped semiconductor layer sequentially grown on the portion of the upper mirror layer exposed through the second electrode,
        a third electrode formed on the second doped semiconductor layer and provided at a central portion thereof with an opening for exposing the central portion of the third electrode, and lower and upper insulating layers respectively sandwiched between the first doped semiconductor layer and the intrinsic semiconductor layer and between the intrinsic semiconductor layer and the second doped semiconductor layer, each of the insulating layers having an opening at a central portion thereof and serving to remove a photocurrent resulting from a spontaneous emission light emitted from the surface emitting laser.

2. The surface emitting laser device according to claim 1, wherein:
    each of the first and second doped semiconductor layers comprises a number of grown layers;
    the uppermost one of the grown layers in the first doped semiconductor layer and the lowermost one of the grown layers in the second doped semiconductor layer are made of AlxGa1-xAs;

the lower and upper insulating layers in the monitor photodetector are made of oxidized AlxGa1-xAs, wherein $0.95 \leq x \leq 1$.

3. The surface emitting laser device according to claim 2, wherein:

the first doped semiconductor layer comprises a Zn-doped AlyGa1-yAs layer and a Zn-doped AlxGa1-xAs layer grown in this order; and the lower insulating layer is formed by partially oxidizing the Zn-doped AlxGa1-xAs layer, wherein $0.95 \leq x \leq 1$; and $0 \leq y \leq 0.5$.

4. The surface emitting laser device according to claim 2, wherein:

the second doped semiconductor layer comprises an Si-doped AlxGa1-xAs, an Si-doped AlyGa1-yAs layer, and an Si-doped GaAs layer grown in this order; and the upper insulating layer is formed by laterally oxidizing the Si-doped AlxGa1-xAs layer, wherein $0.95 \leq x \leq 1$; and $0 \leq y \leq 0.5$.

5. The surface emitting laser device according to claim 1, wherein the intrinsic semiconductor layer is located at a maximum internal light intensity of the surface emitting laser.

6. The surface emitting laser device according to claim 1, further comprising:

a high-resistance layer sandwiched between the gain medium layer and the upper mirror layer and provided at a central portion thereof with an opening, the high-resistance layer serving to guide holes to flow only through the central opening thereof.

7. The surface emitting laser device according to claim 6, wherein the high-resistance layer is formed by implanting protons into a few grown layers above the gain medium layer, or by partially oxidizing one of the $Al_xGa_{1-x}$ as in the upper mirror layer, wherein $0.95 \leq x \leq 1$.

8. A method for fabricating a surface emitting laser device including a surface emitting laser including a substrate, a lower mirror layer, a gain medium layer, and an upper mirror layer sequentially grown on an upper surface of the substrate, a first electrode formed at a lower surface of the substrate, and a second electrode formed on the upper mirror layer and provided at a central portion thereof with an opening for exposing the central portion, the surface emitting laser serving to emit light in a growth direction of the layers in response to a drive current applied to the first and second electrodes, and a monolithically integrated monitor photodetector formed on a portion of the upper mirror layer exposed through the opening of the second electrode, the monitor photodetector serving to partially absorb the light emitted from the surface emitting laser, thereby outputting a detect signal for the light, comprising, to fabricate the monitor photodetector, the steps of:

sequentially growing a Zn-doped AlyGa1-yAs layer and a Zn-doped AlxGa1-xAs layer on the upper mirror layer, thereby forming a first doped semiconductor layer on the upper mirror layer;

forming an intrinsic semiconductor layer made of GaAs on the first doped semiconductor layer;

sequentially growing an Si-doped AlxGa1-xAs layer, an Si-doped AlyGa1-yAs layer, and an Si-doped GaAs layer on the intrinsic semiconductor layer, thereby forming a second doped semiconductor layer on the intrinsic semiconductor layer; and laterally oxidizing the Zn-doped AlxGa1-xAs layer and the Si-doped AlxGa1-xAs layer, starting from side surfaces thereof, while preventing central portions thereof from being oxidized, thereby forming lower and upper insulating layers, respectively, wherein $0.95 \leq x \leq 1$; and $0 \leq y \leq 0.5$.

* * * * *